US009576868B2

(12) United States Patent  
Michael et al.

(10) Patent No.: US 9,576,868 B2  
(45) Date of Patent: Feb. 21, 2017

(54) SEMICONDUCTOR DEVICE AND METHOD FOR REDUCED BIAS TEMPERATURE INSTABILITY (BTI) IN SILICON CARBIDE DEVICES

(75) Inventors: Joseph Darryl Michael, Delmar, NY (US); Stephen Daley Arthur, Glenville, NY (US)

(73) Assignee: General Electric Company, Niskayuna, NY (US)

(*) Notice: Subject to any disclaimer, the term of this patent is extended or adjusted under 35 U.S.C. 154(b) by 151 days.

(21) Appl. No.: 13/562,029

(22) Filed: Jul. 30, 2012

(65) Prior Publication Data

US 2014/0027782 A1  Jan. 30, 2014

(51) Int. Cl.
| | |
|---|---|
| *H01L 21/56* | (2006.01) |
| *H01L 23/04* | (2006.01) |
| *H01L 21/50* | (2006.01) |
| H01L 29/78 | (2006.01) |
| H01L 29/16 | (2006.01) |

(52) U.S. Cl.
CPC .............. *H01L 23/04* (2013.01); *H01L 21/50* (2013.01); *H01L 29/1608* (2013.01); *H01L 29/7802* (2013.01); *H01L 2924/0002* (2013.01)

(58) Field of Classification Search
CPC .............. H01L 2224/2919; H01L 2924/13063; H01L 2924/13091; H01L 29/0657
USPC .................................. 257/678, 684, 701, 702
See application file for complete search history.

(56) References Cited

U.S. PATENT DOCUMENTS

| | | | |
|---|---|---|---|
| 5,233,874 A * | 8/1993 | Putty et al. | 73/514.29 |
| 5,830,804 A * | 11/1998 | Cleeves et al. | 438/672 |
| 6,165,822 A * | 12/2000 | Okuno et al. | 438/142 |
| 6,302,987 B1 * | 10/2001 | Wojnarowski et al. | 156/151 |
| 6,309,272 B1 * | 10/2001 | Nishimura | 445/25 |
| 6,319,757 B1 * | 11/2001 | Parsons | H01L 21/0485 |
| | | | 257/E23.118 |
| 6,452,228 B1 * | 9/2002 | Okuno et al. | 257/329 |
| 6,649,446 B1 * | 11/2003 | Goetz et al. | 438/110 |
| 7,030,498 B2 | 4/2006 | Kakamu et al. | |
| 7,042,075 B2 * | 5/2006 | Liebeskind | 257/682 |
| 7,242,055 B2 | 7/2007 | Bojarczuk, Jr. et al. | |
| 7,256,087 B1 | 8/2007 | Sadoughi et al. | |
| 7,629,653 B1 | 12/2009 | Sadoughi et al. | |
| 7,642,147 B1 * | 1/2010 | Kanakasabapathy | |
| | | | H01L 21/823807 |
| | | | 257/E21.632 |
| 7,696,578 B2 * | 4/2010 | Chen et al. | 257/369 |

(Continued)

OTHER PUBLICATIONS

Campbell et al., Atomic-Scale Defects Involved in the Negative-Bias Temperature Instability, IEEE Transactions on Device and Materials Reliability, vol. 7, No. 4. pp. 540-557, Dec. 2007.

(Continued)

*Primary Examiner* — William F Kraig  
*Assistant Examiner* — Edward Chin  
(74) *Attorney, Agent, or Firm* — Robert M. McCarthy

(57) ABSTRACT

A system includes a silicon carbide (SiC) semiconductor device and a hermetically sealed packaging enclosing the SiC semiconductor device. The hermetically sealed packaging is configured to maintain a particular atmosphere near the SiC semiconductor device. Further, the particular atmosphere limits a shift in a threshold voltage of the SiC semiconductor device to less than 1 V during operation.

22 Claims, 6 Drawing Sheets

(56) References Cited

U.S. PATENT DOCUMENTS

| | | | |
|---|---|---|---|
| 7,831,309 B1* | 11/2010 | Humayun et al. | 607/54 |
| 7,919,801 B2* | 4/2011 | Gogoi | 257/298 |
| 7,999,250 B2* | 8/2011 | Gogoi et al. | 257/19 |
| 8,085,258 B2* | 12/2011 | Asano | G09G 3/3233 345/211 |
| 8,119,473 B2* | 2/2012 | Huang | H01L 21/28247 257/E21.621 |
| 8,216,919 B2* | 7/2012 | Kaneko | 438/474 |
| 8,476,737 B2* | 7/2013 | Najafi | B81B 7/0058 257/415 |
| 8,629,061 B2* | 1/2014 | Murali et al. | 438/667 |
| 8,698,292 B2* | 4/2014 | Najafi et al. | 257/678 |
| 2003/0141802 A1* | 7/2003 | Liebeskind et al. | 313/495 |
| 2005/0285482 A1* | 12/2005 | Oita et al. | 310/343 |
| 2006/0145274 A1* | 7/2006 | Chidambarrao | H01L 21/823807 257/412 |
| 2007/0001651 A1* | 1/2007 | Harvey | 320/166 |
| 2007/0138622 A1 | 6/2007 | Nunokawa | |
| 2007/0170436 A1* | 7/2007 | Sugawara | H01L 29/0615 257/77 |
| 2007/0181913 A1* | 8/2007 | Li | H01L 21/761 257/213 |
| 2007/0205521 A1* | 9/2007 | Robinson | 257/787 |
| 2007/0232078 A1* | 10/2007 | Metz et al. | 438/778 |
| 2007/0267690 A1* | 11/2007 | Yu | H01L 29/7393 257/327 |
| 2008/0173934 A1* | 7/2008 | Lee | H01L 21/823807 257/327 |
| 2009/0115026 A1* | 5/2009 | Gerber | H01L 23/60 257/621 |
| 2009/0242901 A1 | 10/2009 | Matocha et al. | |
| 2009/0256137 A1* | 10/2009 | Shukla | C07D 471/06 257/40 |
| 2010/0012962 A1* | 1/2010 | Hong | H01L 33/46 257/98 |
| 2010/0193796 A1 | 8/2010 | Nakano | |
| 2010/0219744 A1* | 9/2010 | Nishimura et al. | 313/495 |
| 2010/0244141 A1* | 9/2010 | Beyer | H01L 21/28088 257/369 |
| 2010/0289080 A1* | 11/2010 | Wei | H01L 21/823807 257/347 |
| 2011/0018005 A1 | 1/2011 | Nakano | |
| 2011/0049713 A1* | 3/2011 | Frohberg | H01L 21/76895 257/741 |
| 2011/0061449 A1* | 3/2011 | Yagi et al. | 73/49.2 |
| 2011/0140077 A1* | 6/2011 | Song | H01L 33/04 257/13 |
| 2011/0180097 A1* | 7/2011 | Huseinovic et al. | 134/1.2 |
| 2011/0193098 A1 | 8/2011 | Autry | |
| 2011/0284876 A1 | 11/2011 | Okamura et al. | |
| 2012/0012861 A1 | 1/2012 | Nakano et al. | |
| 2012/0025251 A1* | 2/2012 | Kazama | H01L 33/20 257/98 |
| 2012/0049202 A1 | 3/2012 | Nakano | |
| 2012/0086075 A1* | 4/2012 | Huang | H01L 21/28247 257/334 |
| 2012/0200546 A1* | 8/2012 | Miyamoto | H01L 27/14623 345/205 |
| 2012/0286370 A1* | 11/2012 | Li | H01L 21/3247 257/408 |
| 2013/0009167 A1* | 1/2013 | Tan | H01L 33/44 257/77 |
| 2013/0032847 A1* | 2/2013 | Chuang | H01L 33/145 257/99 |
| 2013/0075756 A1* | 3/2013 | Arthur et al. | 257/77 |
| 2013/0115730 A1* | 5/2013 | El-Gamal et al. | 438/51 |
| 2014/0027782 A1* | 1/2014 | Michael et al. | 257/77 |
| 2014/0034963 A1* | 2/2014 | Michael et al. | 257/77 |
| 2015/0053920 A1* | 2/2015 | Yeh | H01L 33/14 257/13 |

OTHER PUBLICATIONS

Schroder, Bias Temperature Instability in Silicon Carbide, ISDRS 2009, http://www.ece.umd.edu/ISDRS2009, 2 pages, Dec. 9-11, 2009.

Grasser et al., "A Two-State Model for Negative Bias Temperature Instability", IEEE CFP09RPS-CDR 47th Annual International Reliability Physics Symposium, Montreal, pp. 33-44, 2009.

Cheng et al., "High-Temperature Reliability of 4H-SiC Vertical-Channel Junction Field-Effect Transistors (VJFETs) for Power Conditioning System Applications", 5 pages.

Negoro et al., High-Voltage 4H-SiC pn Diodes Fabricated by p-Type Ion Implantation, Electronics and Communications in Japan, Part 2, vol. 86, No. 12, pp. 44-51, 2003.

Cheng et al., "High-Temperature Reliability Assessment of 4H-SiC Vertical-Channel JFET Including Forward Bias Stress", 4 pages.

Mahapatra et al., "Negative Bias Temperature Instability Basics/Modeling", 47 pages.

Marinella et al., "Evidence of Nedative Bias Temperature Instability in 4H-SiC Metal Oxide Semiconductor Capacitors", Applied Physics Letters, vol. 90, pp. 253508-1 to 253508-3, 2007.

Tsetseris et al., "Physical Mechanisms of Negative-Bias Temperature Instability", Applied Physics Letters, vol. 86, pp. 142103-1 to 142103-3, 2005.

Chante et al., Silicon Carbide Power Devices, IEEE, pp. 125-134, 1998.

Li et al., "The Role of Hydrogen in Negative Bias Temperature Instability of pMOSFET", Chinese Physics, vol. 15, No. 4, pp. 833-838, Apr. 2006.

Gurfinkel et al., Ultra-Fat Measurements of Vth Insabilty in SiC MOSFETs Due to Positive and Negative Constant Bias Stress, IEEE, pp. 49-53, 2006.

Parallel Seam Sealers, Polaris Electronics Corp.,pp. 1-3, 2002, http://www.polariselectronics.com/Pages/SeamSealerl.html.

High Vacuum Furnace, Product Bulletin, SST International, pp. 1-2.

EP Search Report issued on Dec. 17, 2015 in relation to corresponding EP Application 131782773.

* cited by examiner

US 9,576,868 B2

SEMICONDUCTOR DEVICE AND METHOD FOR REDUCED BIAS TEMPERATURE INSTABILITY (BTI) IN SILICON CARBIDE DEVICES

BACKGROUND

The subject matter disclosed herein relates to semiconductor devices and, more specifically, to silicon carbide semiconductor devices.

For a semiconductor device, such as a silicon (Si) or silicon carbide (SiC) transistor, bias temperature instability (BTI) may cause substantial variability in device performance. For example, negative bias temperature instability (NBTI) in particular may result in a significant change or drift in the threshold voltage of a SiC device when operated under particular conditions, such as negative bias and/or elevated temperatures, over an extended period of time. The NBTI in SiC devices is thought to be a result of interfacial charge trapping (e.g., oxide charges), which may, for example, be induced by operating the device at an elevated temperature, and under a particular bias condition, for extended time periods. For example, a SiC metal-oxide-semiconductor field effect transistor (MOSFET) may experience a threshold voltage shift when subjected to combined voltage and temperature stressing due to NBTI.

In certain cases, the aforementioned NBTI may shift (e.g., decrease) the threshold voltage of a SiC device to the point that the device may become conductive even without an applied gate-source voltage, transforming a normally-off device into a normally-on device. As such, NBTI significantly impacts the reliability and performance of SiC devices. Considerable research has been directed toward designs to mitigate the BTI problem in Si devices, and, in certain instances, the BTI issue has been alleviated or obviated in Si. However, there are significant behavioral differences between Si and SiC devices and, therefore, the mechanisms used to alleviate the problem in Si do not readily translate to SiC. As such, an industry-accepted solution to NBTI in SiC devices has yet to be determined. Accordingly, alleviating the NBTI issue in SiC devices is especially desirable in order to take advantage of the unique operating characteristics (e.g., higher operating temperatures, improved mechanical properties, improved electrical properties, and so forth) that SiC may offer to certain systems and applications.

BRIEF DESCRIPTION

In one embodiment, a system includes a silicon carbide (SiC) semiconductor device and a hermetically sealed packaging enclosing the SiC semiconductor device. The hermetically sealed packaging is configured to maintain a particular atmosphere near the SiC semiconductor device. Further, the particular atmosphere limits a shift in a threshold voltage of the SiC semiconductor device to less than 1 V during operation.

In another embodiment, a metal-oxide field-effect transistor (MOSFET) device includes an enclosure disposed about the MOSFET device. The enclosure is configured to surround the MOSFET device in a reduced pressure environment relative to an environment outside of the enclosure. Further, the reduced pressure environment reduces a threshold voltage shift of the MOSFET device during operation.

In another embodiment, a method includes providing a silicon carbide (SiC) electrical device and sealing the SiC electrical device in a package under an atmosphere having a pressure less than approximately 10 torr. The atmosphere inhibits negative bias temperature instability (NBTI) when operating the SiC electrical device at elevated temperatures, elevated biases, or both, for an extended period of time.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
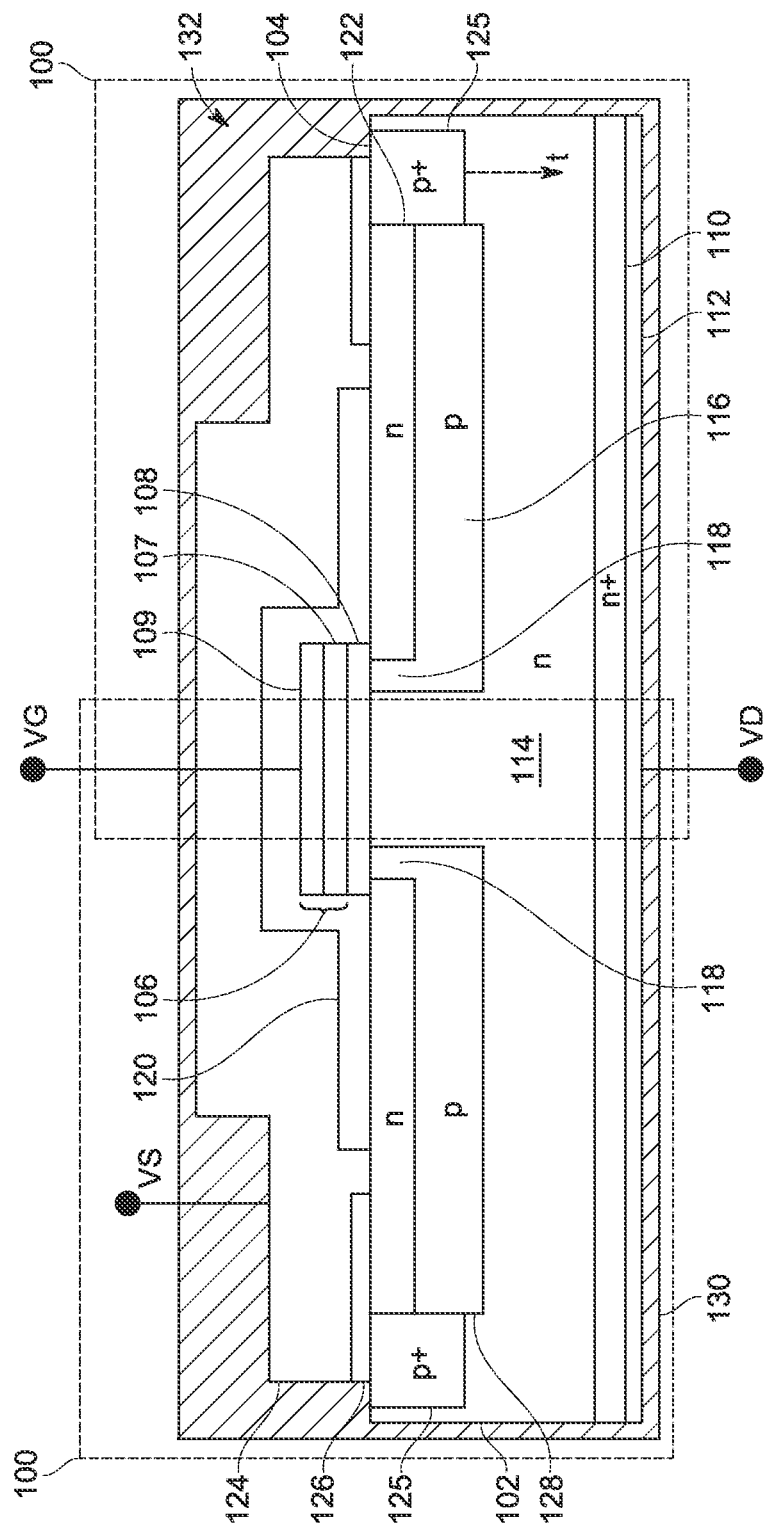
FIG. 1 is a schematic cross-sectional view of a SiC MOSFET, in accordance with an embodiment of the present approach.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As set forth above, BTI, such as NBTI, presents a challenge to semiconductor device reliability. It should be appreciated that the physics and chemistry associated with the BTI phenomenon are complex. As such, while the exact mechanism of BTI may not be entirely understood, present embodiments provide systems and methods for inhibiting (e.g., reducing, limiting, alleviating, or otherwise diminishing) BTI, such as NBTI, during the operation of semiconductor devices (e.g., SiC MOSFETs). In particular, the present approach involves controlling the local atmosphere surrounding the device during operation. As set forth in detail below, in certain embodiments, the semiconductor device may be packaged such that a vacuum environment may be maintained around the device during operation. In other embodiments, the semiconductor device may be packaged such that an inert atmosphere is maintained around the device during operation. In still other embodiments, the semiconductor device may be utilized in applications in which they are subjected to vacuum during operation (e.g., space related applications, test chamber applications, and so forth). Accordingly, using the presently disclosed approach, BTI may be significantly reduced to tolerable levels (e.g., on the order of tenths of a volt rather than on the order of several volts).

While the following disclosure may be generally focused on NBTI in SiC MOSFETs, in should be appreciated that the solutions and techniques detailed herein for mitigating BTI may have applicability to other semiconductor devices, such as insulated gate bipolar transistors (IGBT), MOS controlled thyristor, and gate controlled thyristor. For explanatory purposes, the MOS Controlled thyristor (MCT) may include two MOSFETs built into the structure and may be sensitive to a shift in threshold voltage (VTH) as a result of BTI effects. It is also contemplated that the techniques detailed herein will also mitigate the effects related to positive bias threshold instability (PBTI) which refers to the VTH effects that occur under a positive bias.

With the foregoing in mind, FIG. 1 illustrates a metal-oxide semiconductor field effect transistor (MOSFET) 100, in accordance with an example embodiment of the present approach. In certain embodiments, the illustrated MOSFET 100 may be a SiC-based MOSFET designed for high-temperature operation (e.g., above approximately 125° C., above approximately 175° C., and/or above approximately 300° C.). Additionally, the illustrated MOSFET 100 may be fabricated using standard microelectronic fabrication processes. These processes may include, for example, lithography, film deposition/growth methods (e.g., physical and chemical vapor deposition, plating, oxidation, etc.), crystal growth methods, and wet and dry etching methods. The illustrated MOSFET 100 includes a substrate 102, which may be made of a semiconductor material, such as silicon carbide (SiC). The substrate 102 may be a semiconductor die or wafer that defines a major surface 104 and a surface normal direction or "thickness direction," t, which extends normally from the surface and into the substrate 102. It should be appreciated that FIG. 1 is intended to illustrate the relative positions of the various components of the MOSFET 100 and should not be construed as implying relative scales or dimensions of these components.

The illustrated surface 104 supports a gate electrode 106. Additionally, the illustrated gate electrode 106 is disposed on an insulation layer 108 (which may also be referred to as a gate oxide or gate dielectric layer) that is in direct contact with the surface 104 of the substrate 102. The insulation layer 108 may generally be made from an electrically insulating material, such as silicon dioxide ($SiO_2$). Furthermore, the illustrated insulation layer 108 extends along the surface 104 and may extend to any point up to the contact layer 126. The gate electrode 106 may include a polycrystalline silicon layer 107, and may also include a low-resistance layer 109 formed, for example, of electrically conductive material (e.g., metal and/or silicide). The gate electrode 106 may be configured to receive a gate voltage, VG.

The illustrated substrate 102 also defines a second surface 110 that is in contact with a drain electrode 112, which is generally configured to receive a drain voltage, VD. It should be noted that FIG. 1 is a schematic cross-sectional view of a single MOSFET cell and that the full MOSFET device is typically comprised of large number of cells, situated next to one another, sharing a common gate electrode 106 and drain electrode 112.

The illustrated substrate 102 includes a drift region 114 in addition to a well region 116, which is disposed adjacent to the drift region 114 and proximal to the surface 104. The drift region 114 may be doped with a first dopant type and have a first conductivity type with first majority charge carriers, while the well region 116 may be doped with a second dopant type and have a second conductivity type with second majority charge carriers. For example, in the SiC substrate 102 the first dopant type may be one or more of nitrogen and phosphorus ("n-type dopants"), while the second dopant type may be one or more of aluminum, boron, gallium, and beryllium ("p-type dopants"), resulting in n-doped and p-doped regions, respectively. For such an embodiment, the first and second majority charge carriers would be electrons and holes, respectively.

The illustrated substrate 102 further includes a source contact region 122 having the first conductivity type (e.g., n-type in FIG. 1). The well region 116 may be disposed proximal to the contact region 122 such that the well region 116 may include therein a channel region 118 disposed proximal to the gate electrode 106. For example, the channel region 118 may extend along the surface 104 under the gate electrode 106 (where "under" means further along the thickness direction t). Additionally, a dielectric layer 120, sometimes referred to as an inter-layer dielectric (ILD), may be disposed over the gate electrode 106 and the insulation layer 108. In one example the dielectric layer is a material including phosphorous silicate glass (PSG).

In one embodiment, the source contact region 122 may be disposed adjacent to the surface 104 and the well region 116 may surround the source contact region 122. The substrate 102, in certain embodiments, also includes a body contact region 125 having the second conductivity type (e.g., p-type in FIG. 1). The body contact region 125 in the illustrated embodiment is disposed adjacent to the well region 116 and to the surface 104. A source electrode 124 (e.g., formed of metal, such as aluminum) may disposed over the source contact region 122 and body contact region 125 and may be configured to receive a source voltage, VS. Further, the source electrode 124 may be in electrical contract with both the source contact region 122 and body contact region 125. For example, in the illustrated embodiment, electrical contact between the source electrode 124 and the source contact region 122 and body contact region 125 is made via a contact layer 126 (e.g., formed of nickel or another suitable metal).

It should be appreciated that the illustrated packaging 130 may include a hermetically sealed package (e.g., an integrated circuit package) or an enclosure (e.g., a vacuum chamber or other suitable chamber) for maintaining a particular atmosphere 132 (e.g., pressure and/or gas composition) near the SiC device. It should be appreciated that, in certain embodiments, the packaging 130 may conform to the shape of the device 100, as illustrated in FIG. 1, while, in other embodiments, the packaging 130 may be any suitable shape. In certain embodiments, the pressure inside the packaging 130 may be less than approximately 760 torr, less than approximately 500 torr, less than approximately 100 torr, less than approximately 10 torr, less than approximately 1 torr, less than approximately 0.1 torr, or approximately $10^{-7}$ torr. In certain embodiments, the pressure inside the packaging 130 may be between approximately 0.001 torr and approximately 10 torr, between approximately 0.01 torr and approximately 1 torr, between approximately 0.05 torr and approximately 0.5 torr, or approximately 0.1 torr. Furthermore, it should be appreciated that, in addition to or in alternative to the reduced pressure, the packaging 130 may be filled with a particular gas or mixture of gasses. For example, in certain embodiments, the packaging 130 may maintain an atmosphere 132 about the MOSFET 100 that includes a reduced pressure (e.g., less than 760 torr, approximately 0.1 torr, or approximately $10^{-7}$ torr) of room air. In certain embodiments, the packaging 130 may maintain an atmosphere 132 about the MOSFET 100 that includes a reduced pressure (e.g., approximately 1 torr or approximately 0.1 torr) of an inert gas, such as argon, nitrogen, helium, krypton, xenon, or another suitable inert gas. In other embodiments, packaging 130 may maintain an atmosphere 132 about the MOSFET 100 that includes slightly less than atmospheric pressure (e.g., between approximately 500 torr and approximately 750 torr) of an inert gas (e.g., argon, nitrogen, helium, krypton, xenon, or another suitable inert gas).

In certain embodiments, the packaging 130 may be constructed of metals, polymers, or a composite materials suitable for maintaining the atmosphere 132 (e.g., a vacuum or inert atmosphere) near the SiC device (e.g., MOSFET 100). For example, in certain embodiments, the packaging 130 may be constructed of a number of metallic pieces that are bonded or fused together to provide a hermetically sealed metal packaging 130. By specific example, in certain implementations, the SiC device 100 may be placed in a vacuum furnace (e.g., Model 3140 or 3150 available from SST International of Downey, Calif.) for sealing. By further specific example, in certain embodiments, the package 130 may include a number metal pieces that are maintained around the SiC device 100 while in a chamber of the vacuum furnace, which is pumped down to a reduced pressure (e.g., in the milli-torr or micro-torr range) before heating the device 100 and package 130. In such an embodiment, after heating the chamber of the vacuum furnace to a suitable temperature, solder near the edges of the package 130 (or portions of the package 130 near the edges that have melted) may flow into position along the seam to form a hermetic seal between the pieces of the package 130 upon cooling. In other embodiments, metallic pieces of a metallic package 130 may be welded to one another around the SiC device under a controlled, reduced atmosphere. For example, seam sealers (e.g., the Venus III™ or Venus IV™ seam sealers available from Polaris Electronics Corp., or other suitable sealing systems) may be used to manually, automatically, or semi-automatically weld two or more pieces of the metallic packaging 130 together around the SiC device 100 under a reduced pressure (e.g., in the milli-torr or micro-torr range) and/or inert atmosphere. In other embodiments, the package 130 may be include two or more pieces made from one or more rigid (e.g., metal, polymer, or composite) materials. In such embodiments, the package 130 and the SiC device 100 may be placed within a vacuum chamber (e.g., providing a vacuum and/or inert atmosphere) such that the rigid pieces of the package 130 may be bonded to one another using a glue, resin, epoxy, or other suitable sealing material to provide a hermetically sealed package 130 upon curing. In still other embodiments, the SiC device 100 may be placed inside of a chamber configured to provide a particular (e.g., reduced pressure and/or inert) atmosphere around the SiC device 100 while a segmented or unitary polymer layer is applied to and sealed around the SiC device 100 to provide a hermetically sealed package 130.

During operation, the MOSFET 100 may generally act as a switch. When a voltage difference VDS=VD−VS is applied between the drain electrode 112 and the source electrode 124, an output current (IDS) between those same electrodes can be modulated or otherwise controlled by an input voltage VGS applied to the gate electrode 106, wherein VGS=VG−VS. For gate voltages VG less than a "threshold voltage" (VTH) of the MOSFET 100, the current IDS remains nominally at about zero, although a relatively small leakage current may exist even for gate voltages below the threshold voltage. The threshold voltage VTH is a function of, amongst other things, the dimensions, materials, and doping levels in the MOSFET 100, and MOSFETs are typically designed so as to exhibit a predetermined threshold voltage VTH. Circuits incorporating the MOSFET 100 can then be designed to the expected (predetermined) threshold voltage VTH.

It should be appreciated that the threshold voltage (VTH) for a MOSFET is not uniquely defined. There are at least five different techniques for measuring VTH, and for a specific example, they do not necessarily produce exactly the same results. The method employed herein is referred to as the "threshold drain current method," in which the gate voltage at a specified drain current is taken to be the threshold voltage.

Figure 2:
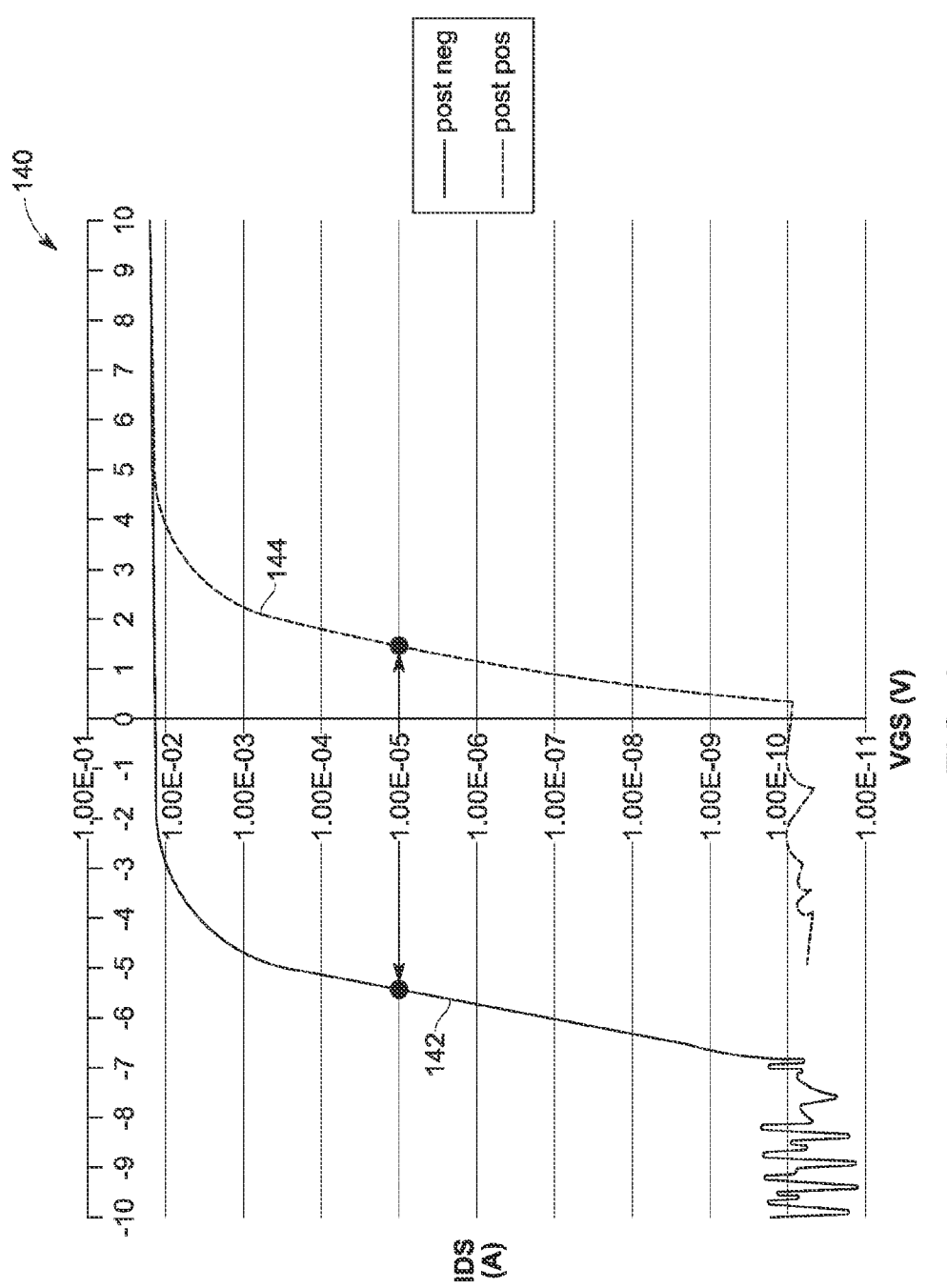
FIG. 2 is a plot of drain current as a function of gate voltage for a conventional MOSFET before and after voltage and temperature stressing.

Conventional MOSFETs, including silicon or SiC MOSFETs, have been found to experience a shift in the threshold voltage due to NBTI when subjected to a potential difference between the gate and source electrodes 106, 124 and, particularly, when subjected to this potential at elevated temperatures and for extended periods of time. Specifically, as mentioned, negative bias temperature instability (NBTI) is a concern for SiC devices. Illustrating an example of this threshold voltage shift, FIG. 2 is a plot 140 of drain current as a function of gate voltage for a conventional MOSFET before and after voltage and temperature stressing. That is, FIG. 2 illustrates the NBTI effect in a stressed SiC MOSFET device lacking the packaging 130 set forth above and operating under atmospheric conditions (e.g., approximately 760 torr of room air).

With respect to FIG. 2, a threshold drain current method, which is a variation of the "sub-threshold technique," may be used when characterizing the NBTI phenomenon in the SiC MOSFET device. Example test conditions used for generating the data illustrated in plot 140 of FIG. 2 are set forth below. In certain embodiments, the test conditions may be such that the transfer curve measurements are taken on MOSFETs at constant stress temperature. For example, first, the gate voltage may be held at a constant −20 volts (V) for 15 minutes and the VDS may be held at 0 V. Then, a small constant voltage may be applied between the source and drain terminals (e.g., approximately 100 mV) and the gate voltage may be swept from −10 V to +10 V, a range large enough to capture the lower current range of the MOSFET (e.g., less than 0.1 nano-amps in this particular case) up to the saturation current (e.g., approximately 16 milli-amps), defining the "post neg" transfer curve 142 depicted in FIG. 2. A constant voltage gate positive stress bias of +20 V may then be applied to the gate for an additional 15 minutes, with VDS=0 V. Finally, a similar reverse sweep of the gate voltage may be conducted from +10 V to −10 V to capture the "post pos" transfer curve 144 with a small constant voltage being applied between the source and drain terminals (e.g., approximately 100 mV).

The use of 10 micro-amps as the threshold drain current of choice for VTH determination is done for practical reasons. For example, it is small enough to reside on the linear sub-threshold portion of the semilog transfer curve, and is large enough to measure accurately and easy to extract from the data. The MOSFET parameters and test conditions for data collection are as follows: VDS=0.1 V; Temp=175° C.; gate oxide thickness (Tox)=500 Angstroms, Device Active Area=0.067 $cm^2$; Area of one MOS cell=1.6E-4 $cm^2$; channel width to length ratio (W/L) of one MOS cell=6900. Scaling the threshold drain current to larger or smaller devices has a linear dependence on Device Active Area, Area of one MOS cell and W/L. It should be noted however, that threshold current scales inversely with gate oxide thickness (Tox).

Accordingly, FIG. 2 demonstrates the drift or shift in the threshold voltage (e.g., a shift in the voltage where IDS increases significantly) following positive and negative gate bias stressing. The vertical scale is the drain current (amps), the horizontal scale is the gate to source voltage (volts). The threshold voltage shift thus represents an example of the effects of bias temperature instability (BTI). The VTH drift is taken as the voltage difference between the VTH positive voltage stress value and the VTH negative voltage stress value at 10 micro-amps of source to drain current. In the example illustrated in FIG. 2, the VTH drift is approximately 6.9 V.

Figure 3:
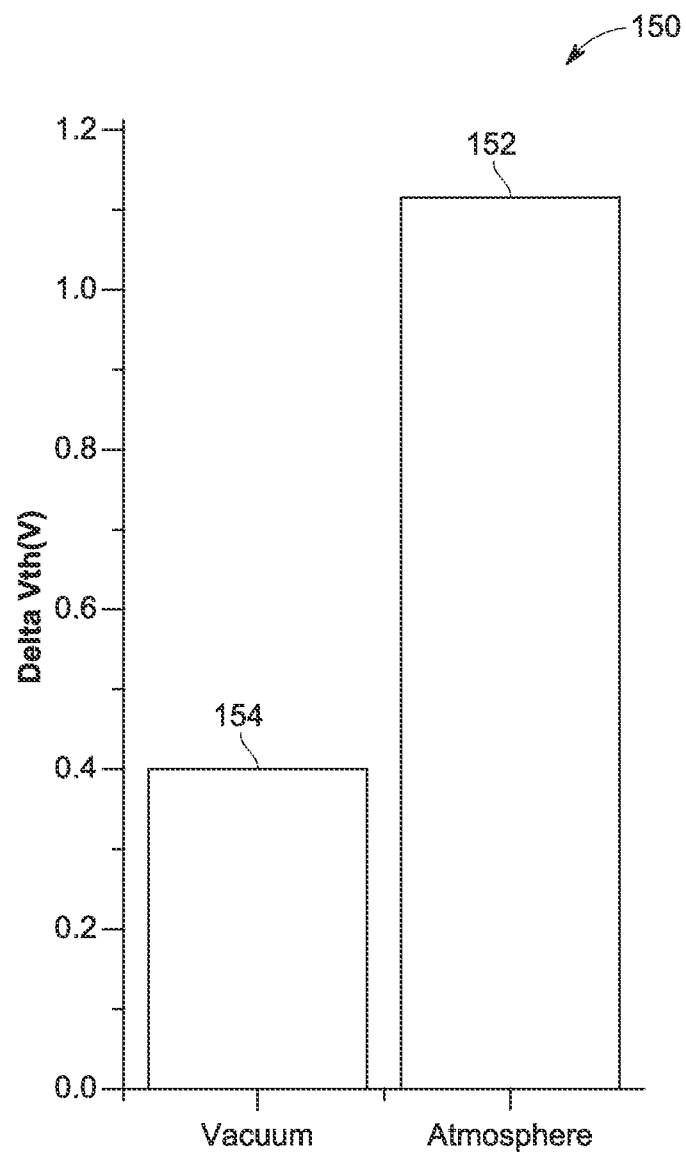
FIG. 3 is a plot of the change in the threshold voltage of a device under normal atmosphere and under vacuum, in accordance with an embodiment of the present approach.

With the foregoing in mind, FIG. 3 includes a plot 150 of the change or shift in the threshold voltage (e.g., $\Delta$VTH) of a SiC MOSFET device due to the NBTI effect under different atmospheric conditions, in accordance with an example of the present approach. In particular, FIG. 3 illustrates the $\Delta$VTH for a SiC MOSFET device under atmospheric conditions (e.g., approximately 760 torr of room air) as well as the $\Delta$VTH for the SiC MOSFET device in vacuum (e.g., less than approximately 0.1 torr, approximately $10^{-7}$ torr, or another suitable reduced pressure). To obtain the data illustrated in plot 150, the $\Delta$VTH may be determined (e.g., as set forth above with respect to FIG. 2) on the SiC MOSFET device at 150° C., under atmospheric conditions. Illustrated by bar 152 of plot 150, this measurement represents an approximately 1.0 V to approximately 1.1 V $\Delta$VTH for the SiC MOSFET device due to the NBTI effect under atmospheric conditions. Subsequently, the SiC MOSFET device may be placed under reduced pressure (e.g., less than approximately 0.1 torr, approximately $10^{-7}$ torr, or another suitable reduced pressure) and the $\Delta$VTH may be once again determined. Illustrated by the bar 154 of the plot 150, this measurement represents an approximately 0.3 V to approximately 0.4 V $\Delta$VTH for the SiC MOSFET device due to the NBTI effect in a vacuum environment.

As such, FIG. 3 clearly illustrates that the $\Delta$VTH resulting from NBTI in the SiC MOSFET device under atmospheric conditions (e.g., illustrated by bar 152) is more than double the $\Delta$VTH resulting from NBTI in the SiC MOSFET device under vacuum (e.g., illustrated by bar 154). Accordingly, operating the SiC MOSFET device in a vacuum appears to substantially reduce (e.g., impede, alleviate, or otherwise diminish) the $\Delta$VTH and/or the BTI (e.g., NBTI) phenomenon in the device. In certain embodiments, the $\Delta$VTH achieved through the present approaches may be less than 1 V, less than 0.8 V, less than 0.5 V, less than 0.4 V, less than 0.3 V, less than 0.2 V, or less than 0.1 V. Furthermore, in certain embodiments, the reduced $\Delta$VTH enabled by the present approaches may be approximately 75%, 50%, 40%, 30%, 25%, 10%, or 5% the $\Delta$VTH observed for SiC not using the presently disclosed reduced pressure techniques. It should be further appreciated that since BTI effects may induce $\Delta$VTH as large as several volts (e.g., 2 V to 5 V) in typical SiC MOSFETs, the present techniques afford a substantial improvement to device reliability.

Figure 4:
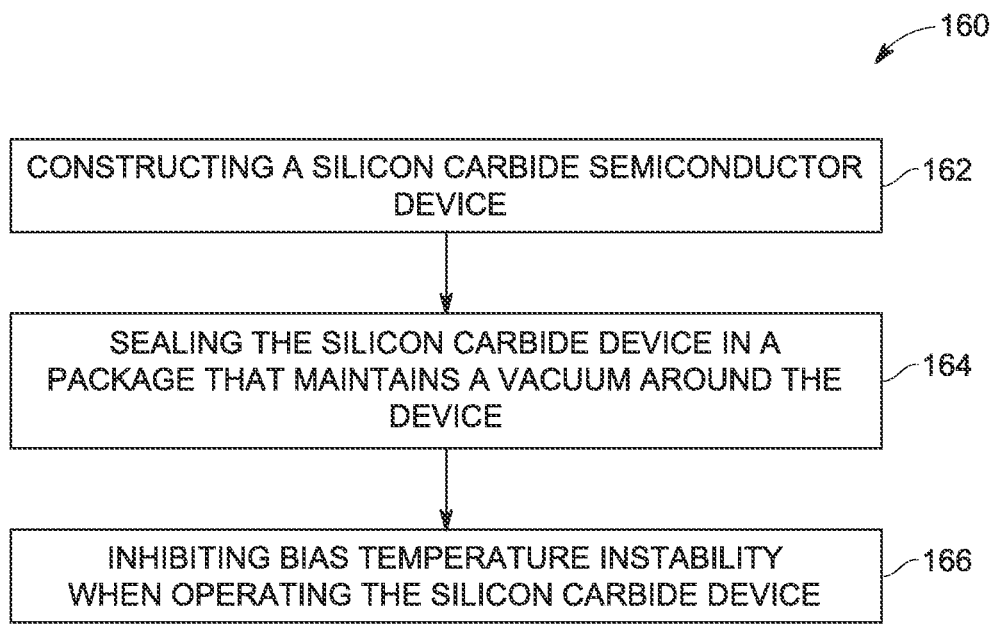
FIG. 4 is a flow diagram illustrating an embodiment of a process for constructing and sealing a SiC device in a vacuum package, in accordance with an embodiment of the present approach.

With this in mind, it is envisioned that one implementation of the present approach involves utilizing a SiC MOSFET having a packaging 130, as set forth above with respect to FIG. 1. That is, in certain embodiments, SiC devices, such as SiC MOSFET devices, may be packaged (e.g., using packaging 130) such that the SiC MOSFET is maintained in a reduced pressure environment throughout operation. For example, turning to FIG. 4, a flow diagram illustrates an embodiment of a process 160 for inhibiting NBTI in a SiC MOSFET using the packaging 130. The illustrated process 160 begins with constructing (block 162) a silicon carbide (SiC) semiconductor device, such as the SiC MOSFET 100 illustrated in FIG. 1. During packaging, the SiC device may be sealed (block 164) in a package (e.g., packaging 130) that maintains a vacuum (e.g., a reduced pressure relative to atmospheric pressure) around the device. For example, in certain embodiments, the pressure of the atmosphere 132 surrounding the SiC device may be may be less than approximately 700 torr, less than approximately 250 torr, less than approximately 75 torr, less than approximately 50 torr, less than approximately 5 torr, less than approximately 0.5 torr, or less than approximately 0.05 torr. By vacuum packaging the SiC device in this manner, BTI (e.g., NBTI) may be inhibited (block 166) by the vacuum or reduced pressure environment when operating the SiC device.

Figure 5:
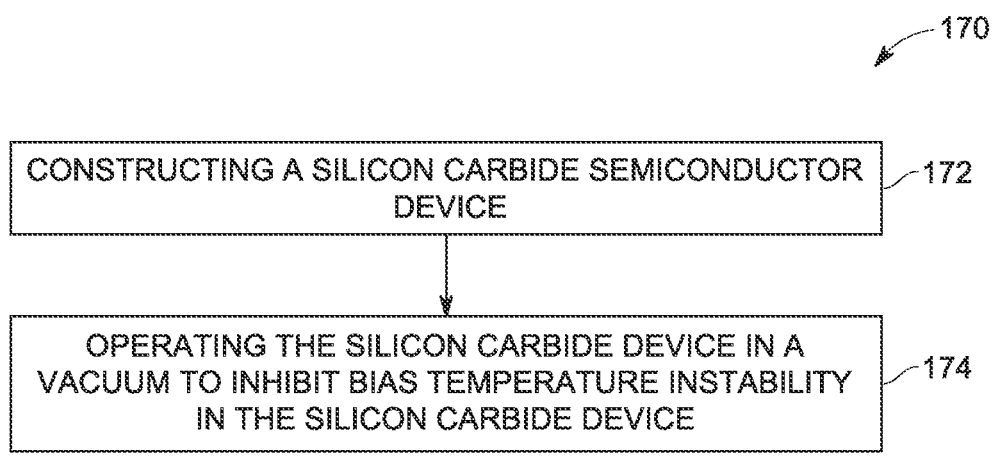
FIG. 5 is a flow diagram illustrating an embodiment of a process for constructing a SiC device and using the device in a vacuum, in accordance with an embodiment of the present approach.

However, in other embodiments, it is also envisioned that another implementation of the present approach involves utilizing a SiC device for applications involving a vacuum environment. That is, in certain embodiments, rather than vacuum packaging a SiC device, as set forth above, the device may instead be configured to operate in an environment of reduced or substantially no pressure. For example, turning to FIG. 5, a flow diagram illustrates an embodiment of another process 170 for inhibiting NBTI in a SiC device. The illustrated process 160 begins with constructing (block 162) a silicon carbide (SiC) semiconductor device, such as the SiC MOSFET 100 illustrated in FIG. 1, but a device lacking the packaging 130 discussed above. Once constructed, the SiC device may be operated (block 174) in a vacuum to inhibit BTI (e.g., NBTI) in the SiC device during operation. For example, in certain embodiments, a SiC MOSFET may be operated in the vacuum of space (e.g., for space shuttle and/or satellite applications) or in the reduced pressure environment (e.g., for a vacuum or pressure test chamber) in order to inhibit NBTI in the device during operation.

Figure 6:
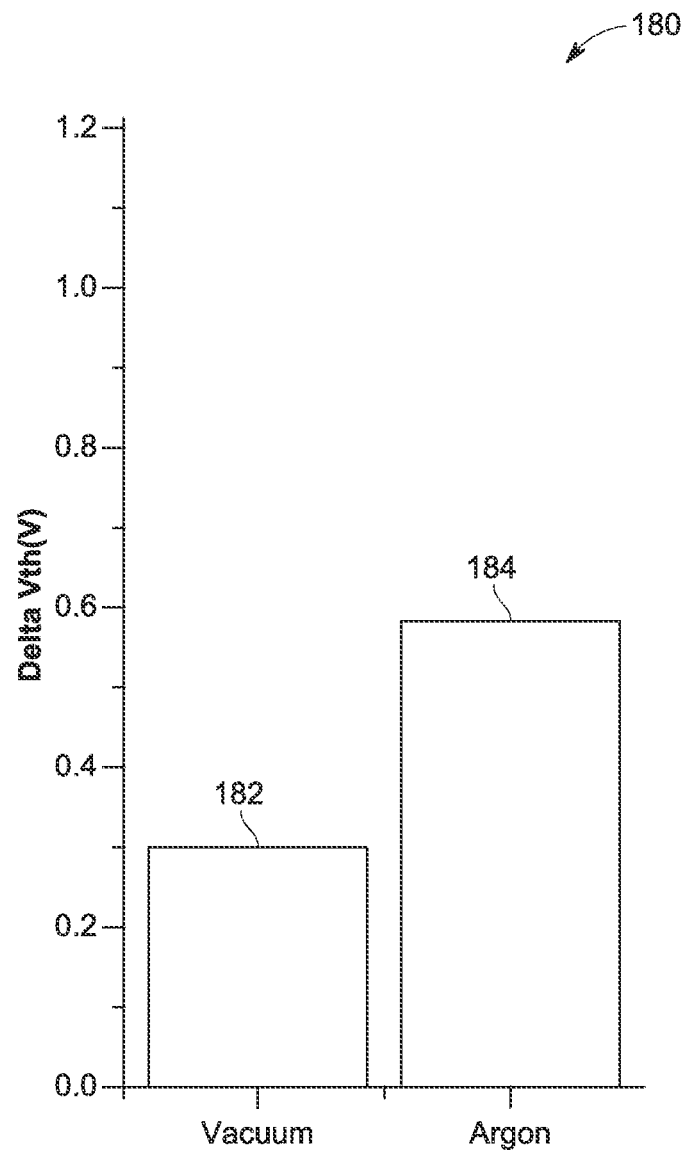
FIG. 6 is a plot of the change in the threshold voltage of a device under a reduced pressure of air and under a reduced pressure of argon, in accordance with an embodiment of the present approach.

FIG. 6 illustrates a plot 180 of $\Delta$VTH for a SiC MOSFET device due to the NBTI effect under different atmospheric conditions, in accordance with an example of the present approach. In particular, FIG. 6 illustrates $\Delta$VTH for a SiC MOSFET device under a substantially reduced pressure (e.g., less than approximately 0.1 torr or approximately $10^{-7}$ torr) of air as well as $\Delta$VTH for the SiC MOSFET device under a reduced pressure argon atmosphere 132 (e.g., less than approximately 760 torr, less than 1 torr, or approximately 0.1 torr of argon). To obtain the data illustrated in plot 180, the $\Delta$VTH may be determined, as set forth above with respect to FIG. 2, on the SiC MOSFET device at 150° C., under vacuum. Illustrated by bar 182 of plot 180, this measurement represents an approximately 0.2 V to approximately 0.3 V ΔVTH for the SiC MOSFET device due to the NBTI effect under vacuum. Subsequently, the SiC MOSFET device may be placed under a reduced pressure atmosphere 132 of argon (e.g., less than approximately 760 torr, approximately 1 torr, or approximately 0.1 torr) and the ΔVTH may be once again determined. Illustrated by the bar 184 of the plot 180, this measurement represents an approximately 0.5 V to approximately 0.6 V ΔVTH for the SiC MOSFET device due to the NBTI effect in an inert atmosphere 132.

As such, FIG. 6 illustrates that the ΔVTH that results from NBTI in the SiC MOSFET device under a reduced pressure inert atmosphere 132 (e.g., illustrated by bars 184) is still substantially greater than (e.g., approximately double) the ΔVTH that results from NBTI in the SiC MOSFET device under a stronger vacuum (e.g., illustrated by bars 182). Accordingly, operating the SiC MOSFET device in a relatively strong vacuum (e.g., less than 1 torr, less than 0.1 torr, or approximately $10^{-7}$ torr) atmosphere 132 appears to substantially reduce (e.g., impede, alleviate, or otherwise diminish) the ΔVTH and/or the NBTI phenomenon in the device relative a higher pressure atmosphere 132 (e.g., greater than 1 torr or 0.1 torr) of a one or more gases (e.g., air or an inert atmosphere, such as argon). However, it should be appreciated that, compared to the ΔVTH for the SiC device under normal atmospheric conditions (e.g., illustrated by bars 152 of FIG. 3), the ΔVTH for the SiC device under the reduced pressure of argon (e.g., illustrated by bars 164 of FIG. 4) may still represent a substantial improvement with respect to NBTI. In certain embodiments, the ΔVTH achieved through the presence the reduced pressure inert atmosphere 132 may be less than 1 V, less than 0.5 V, less than 0.4 V, less than 0.3 V, less than 0.2 V, or less than 0.1 V. Furthermore, in certain embodiments, the reduced ΔVTH enabled by the presence the reduced pressure inert atmosphere 132 may be approximately 75%, 50%, 40%, 30%, 25%, 10%, or 5% the ΔVTH observed for a SiC device not using an inert atmosphere 132 as presently disclosed.

Figure 7:
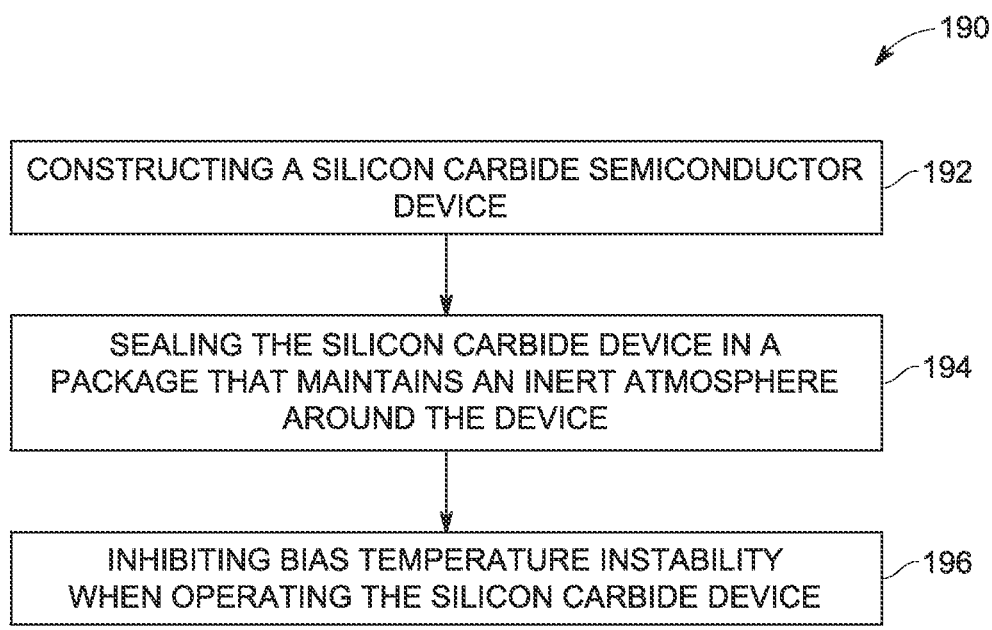
FIG. 7 is a flow diagram illustrating an embodiment of a process for constructing and sealing a SiC device in package under an inert atmosphere, in accordance with an embodiment of the present approach.

With this in mind, it is envisioned that another implementation of the present approach involves utilizing a SiC MOSFET having a packaging 130, as set forth above with respect to FIG. 1. For example, turning to FIG. 7, a flow diagram illustrates an embodiment of a process 190 for inhibiting NBTI in a SiC MOSFET having the packaging 130. The illustrated process 190 begins with constructing (block 192) a silicon carbide (SiC) semiconductor device, such as the SiC MOSFET 100 illustrated in FIG. 1. During packaging, the SiC device may be sealed (block 194) in a package (e.g., packaging 130) that maintains a particular atmosphere 132 around the device. That is, in certain embodiments, SiC devices, such as SiC MOSFET devices, may be packaged (e.g., by packaging 130) such that the SiC MOSFET is maintained in a particular atmosphere 132 (e.g., an inert atmosphere, such as argon, helium, nitrogen, krypton, xenon, or another suitable gas). For example, in certain embodiments, the packaging 130 of the SiC device may be filled with argon, helium, nitrogen, or another suitable gas prior to sealing the packaging 130 around the SiC device, and the inert gas may function to at least partially reduce (e.g., impede, alleviate, or otherwise diminish) the NBTI effect in the device. By packaging the SiC device in this manner, BTI (e.g., NBTI) may be inhibited (block 196) by the selected atmosphere 132 when operating the SiC device. Furthermore, in certain embodiments, a combination approach may be utilized, in which the packaging 130 maintains a reduced pressure environment surrounding the SiC device (e.g., a vacuum of 0.1 torr) in which the remaining gas pressure inside the packaging 130 is produced by an inert gas (e.g., argon, helium, nitrogen, xenon, krypton, mixtures thereof, or another suitable inert gas or mixture).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system, comprising:
a silicon carbide (SiC) semiconductor device, the SiC semiconductor device having a source electrode disposed on top of a top surface of an interlayer dielectric and no intervening layer disposed between the interlayer dielectric and the source electrode; and
a hermetically sealed packaging enclosing the SiC semiconductor device, wherein the hermetically sealed packaging is configured to maintain an atmosphere around the SiC semiconductor device, wherein the atmosphere limits a shift in a threshold voltage of the SiC semiconductor device to less than 1 V during operation, wherein the threshold voltage is a voltage difference between a gate and source at a given source to drain current.

2. The system of claim 1, wherein the atmosphere comprises a vacuum.

3. The system of claim 2, wherein the vacuum comprises a pressure less than approximately 1 torr.

4. The system of claim 2, wherein the vacuum comprises a pressure of approximately 0.1 torr.

5. The system of claim 1, wherein the atmosphere comprises argon, helium, nitrogen, krypton, xenon, or a combination thereof.

6. The system of claim 1, wherein the SiC semiconductor device comprises a metal-oxide field-effect transistor (MOSFET), an insulated gate bipolar transistor (IGBT), a MOS controlled thyristor, or a gate controlled thyristor.

7. The system of claim 1, wherein the packaging comprises an enclosure disposed about the SiC semiconductor device, wherein the enclosure is configured to surround the SiC semiconductor device in a reduced pressure environment relative to an environment outside of the enclosure, and wherein the reduced pressure environment reduces a threshold voltage shift of the SiC semiconductor device during operation.

8. The system of claim 7, wherein the reduced pressure environment comprises a reduced pressure of an inert gas, wherein the inert gas comprises helium, argon, or nitrogen.

9. The system of claim 1, wherein the packaging is formed of metal, polymer, or composite material.

10. The system of claim 9, wherein the packaging is rigid.

11. The system of claim 9, wherein the packaging is formed of a plurality of pieces and edges between the pieces are hermetically sealed.

12. The system of claim 11, wherein the edges are sealed by welds.

13. The system of claim 11, wherein the edges are sealed by solder.

14. The system of claim 11, wherein the edges are sealed by glue, resin or epoxy.

15. The system of claim 11, wherein the edges are sealed by melted portions of the pieces that have cooled.

16. The system of claim 9, wherein the packaging comprises a unity polymer layer.

17. A completed silicon carbide (SiC) semiconductor device, comprising:
- a source electrode disposed directly on top of a top surface of an interlayer dielectric and no intervening layer disposed between the interlayer dielectric and the source electrode; and
- an atmosphere surrounding the SiC semiconductor device, wherein the atmosphere limits a shift in a threshold voltage of the SiC semiconductor device to less than 1 V during operation, wherein the threshold voltage is a voltage difference between a gate and source at a given source to drain current.

18. The SiC semiconductor device of claim 17, wherein the SiC semiconductor device comprises a metal-oxide field-effect transistor (MOSFET), an insulated gate bipolar transistor (IGBT), a MOS controlled thyristor, or a gate controlled thyristor.

19. The SiC semiconductor device of claim 17, wherein the atmosphere comprises a vacuum.

20. The SiC semiconductor device of claim 19, wherein the vacuum comprises a pressure less than approximately 1 torr.

21. The SiC semiconductor device of claim 19, wherein the vacuum comprises a pressure of approximately 0.1 torr.

22. The SiC semiconductor device of claim 17, wherein the atmosphere comprises argon, helium, nitrogen, krypton, xenon, or a combination thereof.

\* \* \* \* \*